United States Patent
Martin et al.

[19]

[11] Patent Number: 5,875,892
[45] Date of Patent: Mar. 2, 1999

[54] PACKAGING CONTAINER WITH HUMIDITY INDICATOR

[75] Inventors: Michelle Martin; Mark Beltran, both of Colton, Calif.

[73] Assignee: Humidial Corporation, Colton, Calif.

[21] Appl. No.: 781,479

[22] Filed: Jan. 10, 1997

[51] Int. Cl.⁶ .................................................. B65D 85/00
[52] U.S. Cl. ...................................... 206/459.1; 116/206
[58] Field of Search .............................. 206/459.1, 710, 206/204; 116/206, 200, DIG. 41

[56] References Cited

U.S. PATENT DOCUMENTS

| | | |
|---|---|---|
| 2,446,361 | 8/1948 | Clibloon . |
| 2,705,451 | 4/1955 | Mueller ........................... 116/DIG. 41 |
| 3,966,440 | 6/1976 | Roberts ..................................... 116/206 |
| 4,971,196 | 11/1990 | Kitamura et al. . |
| 5,095,626 | 3/1992 | Kitamura et al. . |
| 5,238,648 | 8/1993 | Kremen . |
| 5,293,996 | 3/1994 | Duncan . |
| 5,295,297 | 3/1994 | Kitamura et al. . |
| 5,318,181 | 6/1994 | Stover et al. . |

FOREIGN PATENT DOCUMENTS

WO 93/15402   8/1993   WIPO .

*Primary Examiner*—Paul T. Sewell
*Assistant Examiner*—Nhan T. Lam
*Attorney, Agent, or Firm*—Scott R. Cox

[57] ABSTRACT

A packaging container including a humidity indicator system specifically designed for use in packaging electronic circuits, such as integrated circuits. The packaging container is prepared from a water and water vapor proof, anti-static packaging material and contains an opening therein. The humidity indicator system includes a humidity indicator element, a humidity comparison element and a securing system for securing the humidity indicator element to the packaging container, wherein the opening in the packaging material is closed by the humidity indicator system.

7 Claims, 7 Drawing Sheets

PACKAGING CONTAINER WITH HUMIDITY INDICATOR

BACKGROUND OF INVENTION

1. Field of Invention

This invention relates to moisture-proof packaging containers. In particular this invention includes a moisture-proof packaging container containing a humidity indicator system which visually discloses the humidity of the air within the container.

2. Prior Art

Plastic semiconductor devices are susceptible to moisture due to the permeable nature of their plastic components. It is well known that integrated circuits which are contaminated by high levels of moisture may not be useful. Mechanical failure of such contaminated integrated circuits often leads to the subsequent electrical failure of the device which contains the integrated circuit due to thermal and mechanical stresses. Accordingly, exposure of integrated circuits to moisture should be limited.

This concern about limiting the exposure of integrated circuits to moisture has been addressed in the design of shipping packaging for integrated circuits. Currently the preferred method to form a packaging system for integrated circuits includes baking the integrated circuit devices until dry, placing them into a water and humidity proof packaging bag which contains desiccant packets and a humidity indicator card, sealing the bag immediately, and then shipping the device to the customer in these packaging bags. U.S. Pat. No. 4,971,196, 5,095,626, 5,293,996 and 5,295,297 address this problem by disclosing specialized types of packaging for semiconductor products. Each of the packaging containers disclosed by these patents incorporates a moisture indicator device into the packaging material which device is secured to the inside surface of the packaging. See specifically FIGS. 7 and 10 of these patents.

U.S. Pat. No. 5,293,996 in particular discloses a package container for the shipment of integrated circuits containing an observation window. The container is divided into three sections, wherein one of those sections contains a compartment (11) housing a humidity indicator device (16). The humidity indicator device (16) is preferably a humidity indicator card, manufactured by Humidial Corporation. As best understood the card is merely placed within the compartment. The composition of the packaging material of the compartment containing the humidity indicator card is a transparent plastic, thus permitting the moisture indicator card to be viewed from outside of the packaging container.

U.S. Pat. No. 5,318,181 discloses compartmentalized humidity sensing indicators. These humidity sensing indicators are produced on a tape reel and are secured to the inside surface of a continuous strip of humidity indicators.

U.S. Pat. No. 2,446,361 discloses a humidity indicating moisture adsorbent product secured to packaged goods. The product comprises a container (A) onto which is secured a receptacle (B). Contained within the receptacle (B) is a desiccant (C). The receptacle (B) is transparent, may be formed from plastic materials and is screwed into a threaded mounting apparatus which is also secured to the container. It is comprised of a cylindrical wall (16), closed top (17) and a perforated bottom (18). The receptacle (B) is secured in place to the package by a collar (20) and a locking ring (22) containing threads (24, 28). The receptacle (B) is screwed in place using two different designs as disclosed in FIGS. 2 and 3 of the patent. See also U.S. Pat. No. 5,238,648 which discloses a view port in the packaging through which can be viewed an oxygen indicator device.

Current packaging products which are used to ship integrated circuits still exhibit deficiencies, including limitations on the composition of the packaging material. Conventionally, the packaging material used for shipping integrated circuits is opaque, thus preventing easy inspection of the humidity indicator card contained within the packaging unless the packaging material is breached. In certain new products, the composition of the surface material of the packaging must be different from the composition of the remaining portion of the packaging that is adjacent to the humidity indicator so that the humidity indicator card can be viewed from outside of the packaging. In addition, the method for attachment of the humidity indicator device to the inside surface of the packaging material is often not practical.

Accordingly, it is an object of this invention to produce a packaging container which incorporates a humidity indicator device.

It is a further object of this invention to disclose a packaging container which incorporates a humidity indicator device, wherein the humidity indicator device is secured to the packaging material by a securing system.

It is a still further object of this invention to disclose a packaging container which incorporates a humidity indicator device which is easy to produce and accurately discloses the level of the humidity within the packaging container.

It is a still further object of this invention to disclose a packaging container which incorporates a humidity indicator device, comprising a humidity indicator element, with or without a humidity comparison element, and a securing system for securing the humidity indicator element with or without a humidity comparison element together to the packaging container.

These and other objects and features of the present invention will become apparent to those skilled in the art from a consideration of the following detailed description, drawings and claims. The description along with the accompanying drawings provides a selected example of the construction of the device to illustrate the invention.

SUMMARY OF INVENTION

In accordance with the present invention there is provided a packaging container for products sensitive to humidity which includes (a) a humidity indicator system secured to (b) an anti-static, water and water vapor proof packaging material. The packaging material is formed into a packaging bag, wherein said packaging bag contains an opening, wherein the opening is closed by the humidity indicator system, wherein the humidity indicator system comprises a humidity indicator element, with or without a humidity comparison element and a securing means for securing the humidity indicator element and humidity comparison element together and for securing them to the packaging bag and wherein said securing means is moisture and vapor proof.

BRIEF DESCRIPTION OF THE DRAWINGS

This invention will now be described with reference to the accompanying drawings in which.

DETAILED DESCRIPTION OF THE PREFERRED EMBODIMENT

Figure 1:
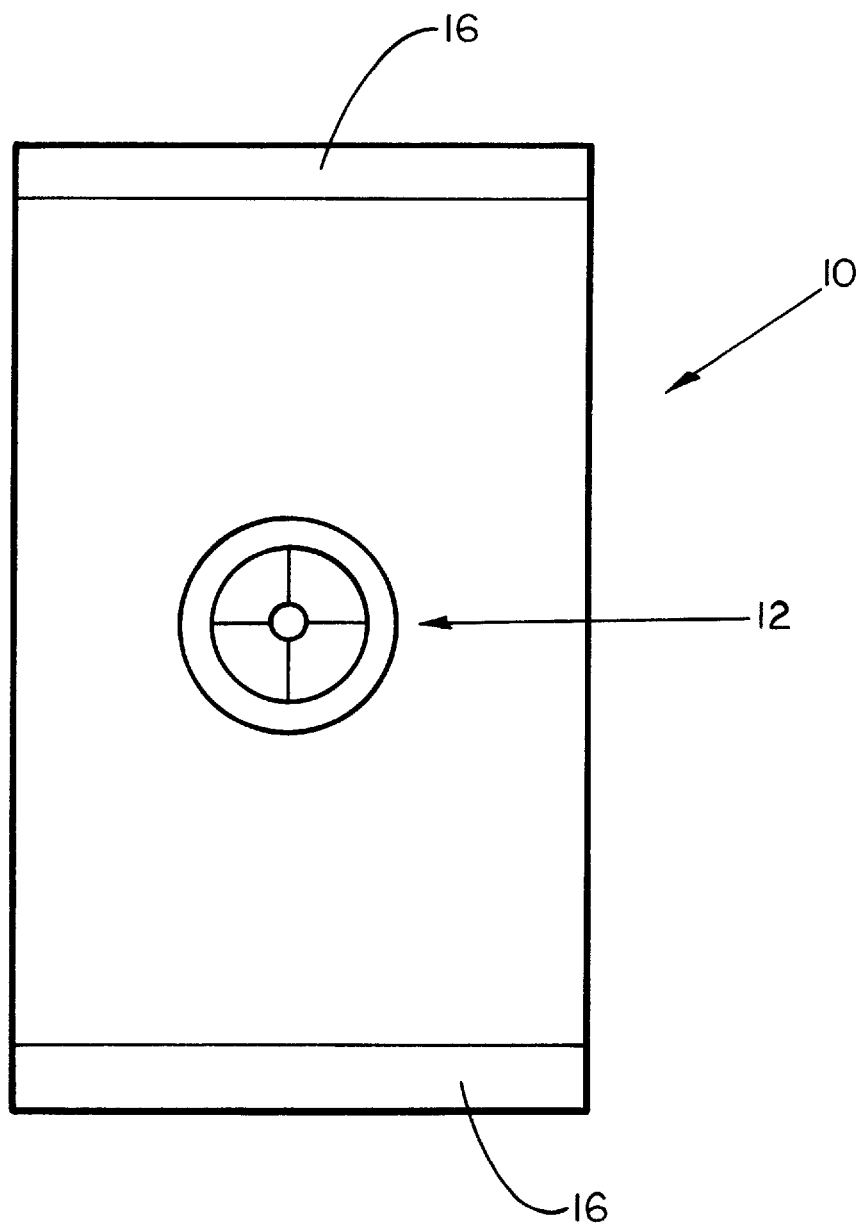
FIG. 1 is a top view of the packaging container which includes a humidity indicator system.

Although the invention is adaptable to a wide variety of uses, it is shown in the drawings for purpose of illustration as embodying a packaging container (10) which includes a humidity indicator system (12), wherein the container comprises an anti-static water and water vapor proof packaging material, wherein the edges (16) of the packaging material are secured together. See FIGS. 1 and 2. One of the edges (17) of the packaging material remains unsealed for introduction into the packaging container of both the product to be shipped (not shown) and a desiccant product (not shown). An opening (18) is provided in the packaging container to receive the humidity indicator system (12). This system (12) comprises a humidity indicator element (20), optionally a humidity comparison element (22) and a securing means for securing the humidity indicator element and optional humidity comparison element together and to the packaging material such that it securely closes said opening (18) in said packaging bag. Several embodiments of the humidity indicator system are disclosed in FIGS. 2–7.

The composition of the packaging container preferably is moisture and water vapor proof and provides electro-static discharge protection. In a preferred embodiment, the packaging material is an anti-static, static shielding, moisture and/or water vapor proof packaging material, such as Dry-Pack®, produced by Richmond Technologies. Once the packaging material is formed, all but one of its edges are secured together by a conventional securing means, such as by heat sealing or by use of an adhesive. One of the edges (17) of the packaging container, however, remains unsealed for introduction of the desiccant product and the product for shipment within the packaging container.

During the formation of the packaging container, an opening (18) is cut into one of the sides of the packaging container. The shape and size of this opening (18) is dependent upon which embodiment of humidity indicator system is secured to the packaging container (10).

Figure 2:
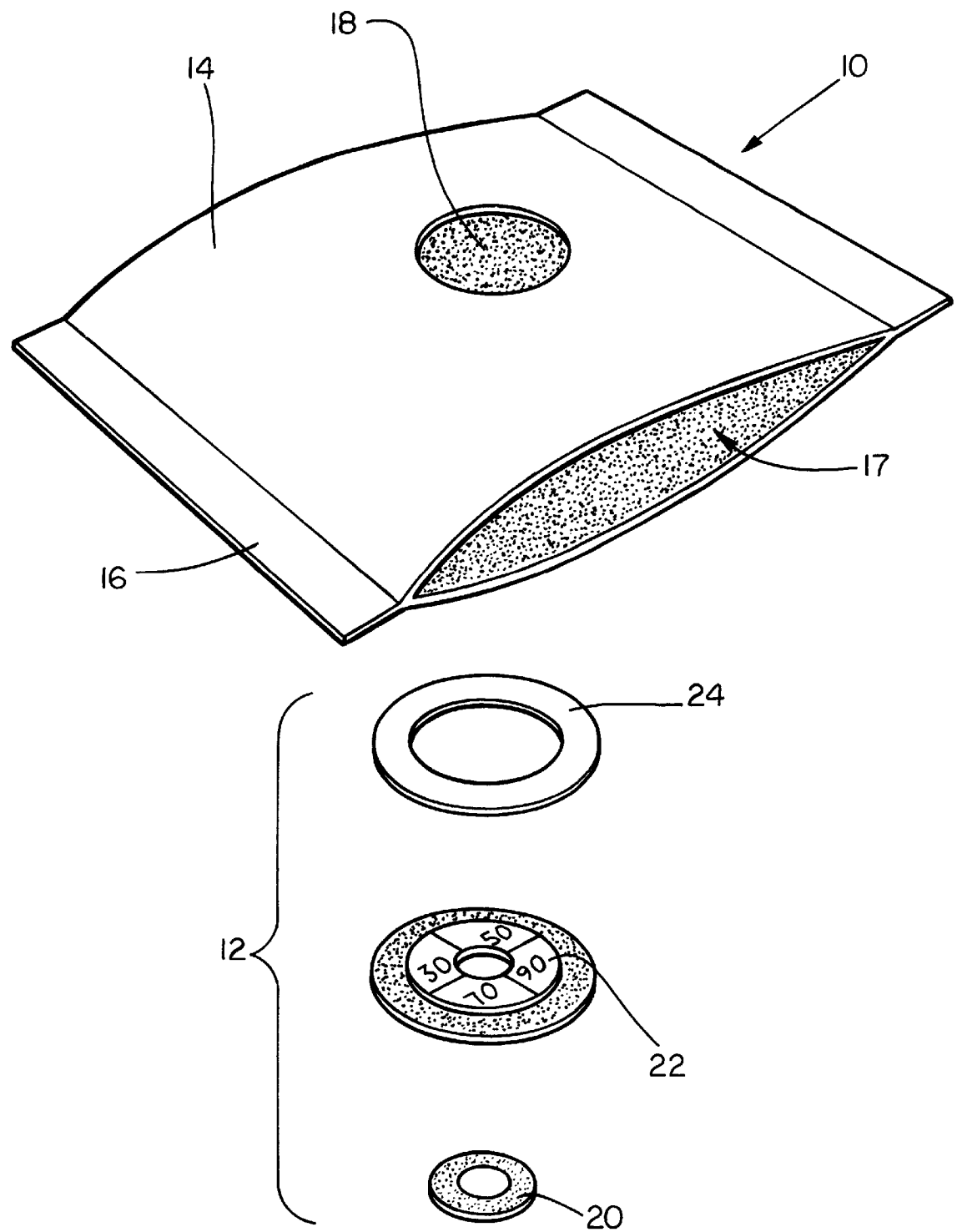
FIG. 2 is an exploded view of a first embodiment of the packaging container which includes a humidity indicator system.

In a first embodiment of the humidity indicator system, a circular opening is cut into the packaging container as shown in FIG. 2. As stated above, the humidity indicator system (12) is comprised of a humidity indicator element (20), preferably a humidity comparison element (22) and a securing means for securing the humidity indicator element (20) and humidity comparison element (22) to the packaging container (10).

The humidity indicator element (20) is preferably formed from a hydrophilic blotter substrate onto which is placed a humidity indicator solution which is sensitive to humidity and which readily discloses the level of humidity in the air surrounding the disk by changing its color depending on the level of humidity. This substrate and humidity indicator solution are well known in the industry. The substrate is preferably blotter paper, for example, manufactured by Custom Paper. Preferably, this humidity indicating solution comprises a solution of cobalt chloride. The preferred cobalt chloride solution is also well known in the industry and is hydroscopic in nature. It demonstrates different colors or different degrees of color based on the amount of moisture in the air surrounding the humidity indicator element (20). The humidity indicator solution is incorporated onto the humidity indicator substrate by conventional means.

Once the humidity indicator solution has been secured onto the substrate, the substrate is formed into the desired shape for use as the humidity indicator element (20). In the first preferred embodiment, the humidity indicator element (20) is formed into a circular disk as shown on FIG. 2.

In order to determine the level of humidity which is indicated by the color of the humidity indicator element (20), the humidity comparison element (22) is secured next to the humidity indicator element. The humidity comparison element (22), which is preferably formed from a material which is not affected by the level of humidity present in the packaging container, is used to compare the level of the humidity shown on the humidity indicator element (20) against known levels of humidity shown by different colors on the humidity comparison element (22). The humidity comparison element (22) of the first preferred embodiment is preferably round with a circular opening cut into its middle. See FIG. 2.

The humidity indicator element (20) is preferably secured to the back of the humidity comparison element (22) by conventional means, such as by an adhesive. By securing the humidity indicator element (20) to the humidity comparison element (22) with a portion of the humidity indicator element (20) which is sensitive to humidity covering a circular opening in the middle of the humidity comparison element (22), it is easy for a viewer of this assembly to determine the relative humidity level within the container by merely comparing the color shown on the humidity indicator element (20) with the various colors referenced on the humidity comparison element (20). The size and shape of the humidity indicator element (20) and humidity comparison element (22) can be altered from that shown in FIG. 2. In addition, a single color humidity comparison element may be substituted for a multicolored humidity comparison element.

Once the humidity indicator element (20) and the humidity comparison element (22) are secured together, they are secured to the packaging material (14) by use of the securing means. In the first embodiment as shown in FIG. 2, the securing means comprises a clear, plastic, circular disk (24) secured to the inside surface of the packaging bag. The clear, plastic circular disk (24) can be manufactured from any clear, water and water vapor proof anti-static film material, such as DRY-PACK® manufactured by Richmond Technologies.

The humidity indicator element (20) and humidity comparison element (22) are joined to the clear plastic disk (24) by conventional means, such as by use of an adhesive. This disk, when properly secured to the packaging container, completely covers and closes the opening (18) which is cut in the packaging container (10). The clear plastic disk (24) is secured to the inside surface of the packaging material (14) by conventional means such as by heat sealing or adhesively bonding it to the inside of the packaging container (10).

Once the products to be shipped have been placed within the packaging container (10) along with the desiccant product, the humidity within that container can be readily checked merely by viewing through the clear plastic disk (24) that is secured to the inside surface of the packaging container (10). Any water vapor inside the packaging container will react with the humidity indicator element (20) to produce a change in its color which then discloses the moisture content of the air within the packaging container (10). By comparing the color of the humidity indicator element (20) with the color shown on the humidity comparison element (22), the level of humidity within the packaging container can be readily determined.

Figure 3:
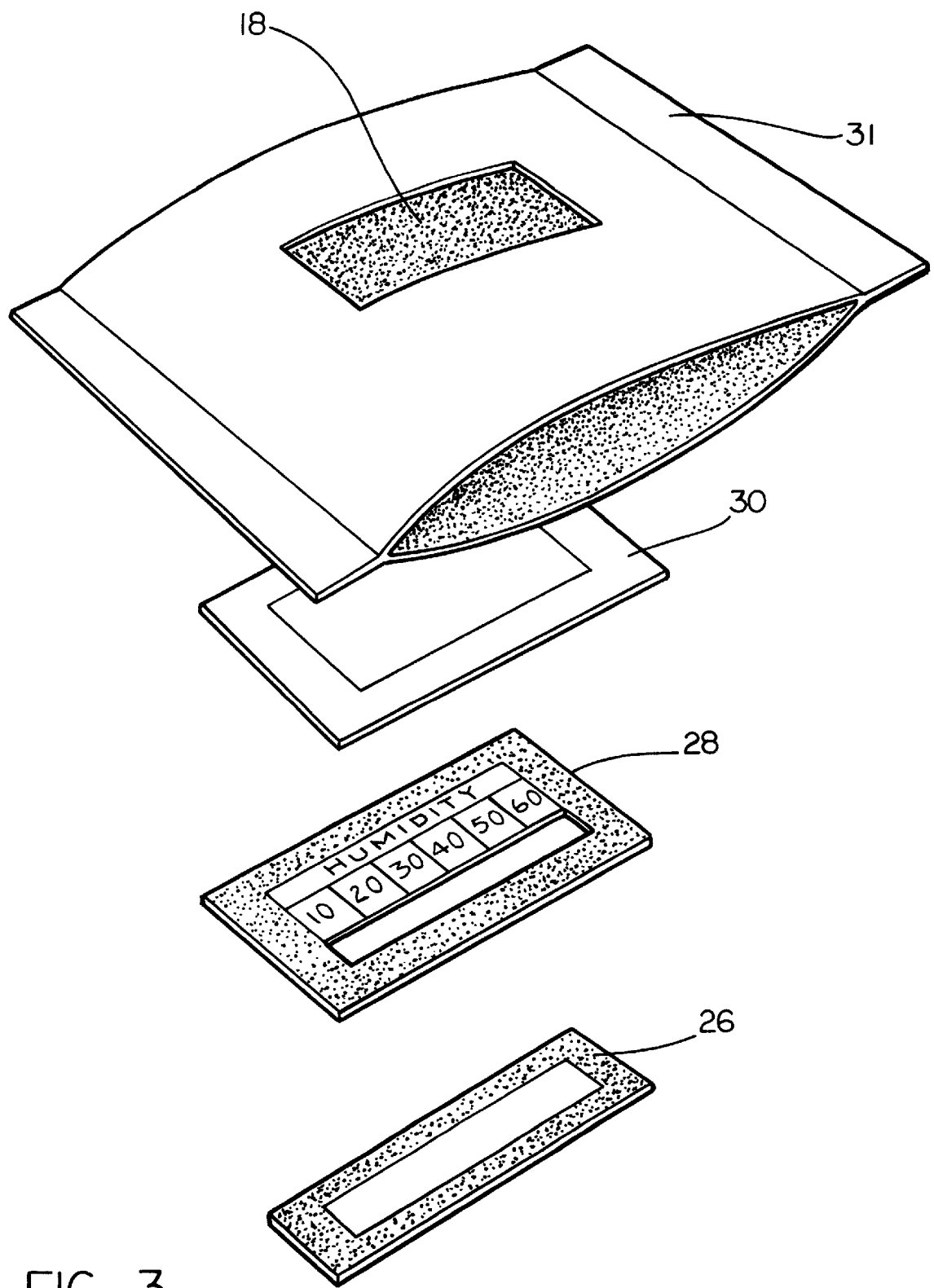
FIG. 3 is an exploded view of a second embodiment of the packaging container which includes a humidity indicator system.
Figure 4:
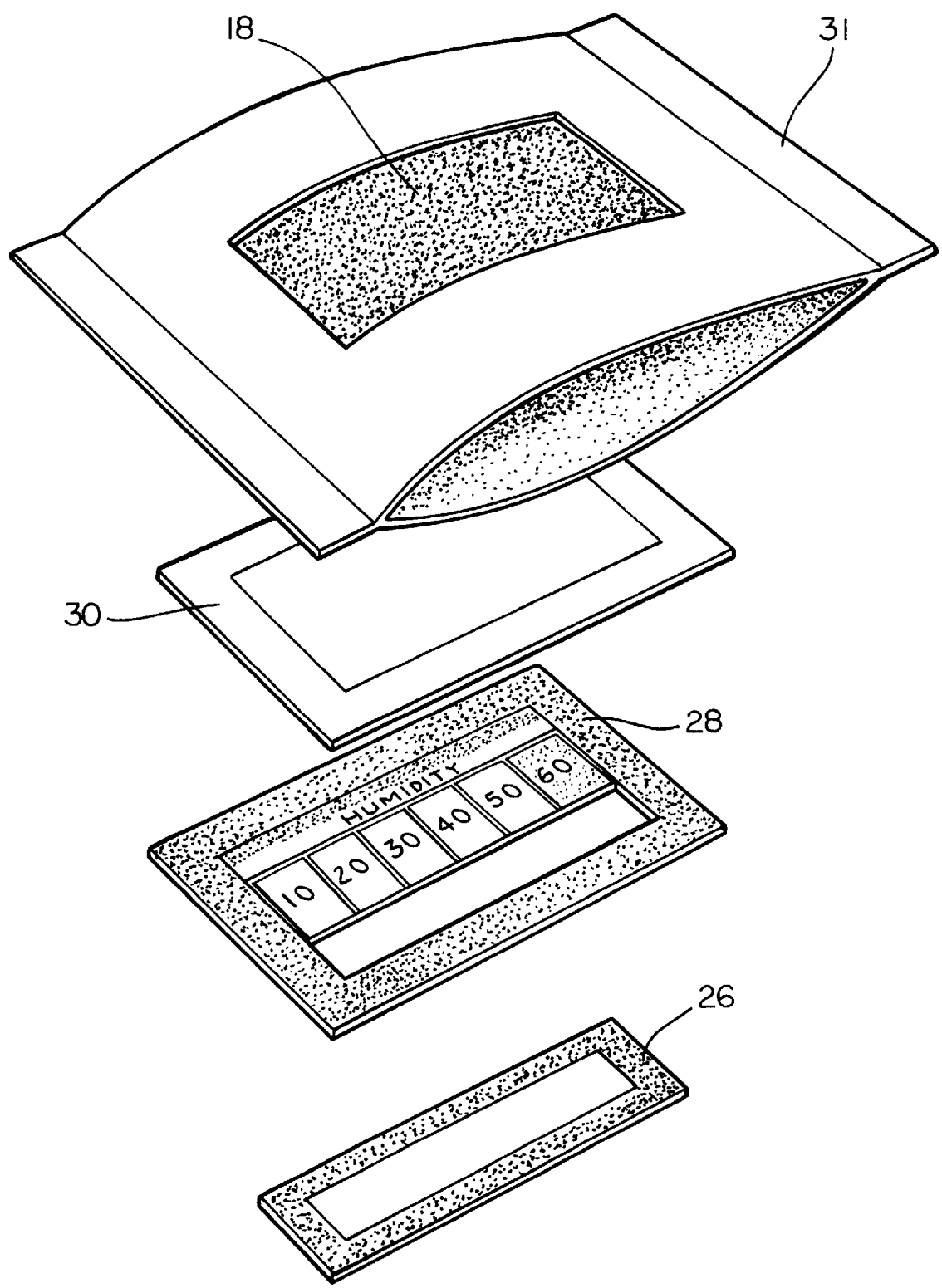
FIG. 4 is an exploded view of a third embodiment of the packaging container which includes a humidity indicator system.
Figure 5:
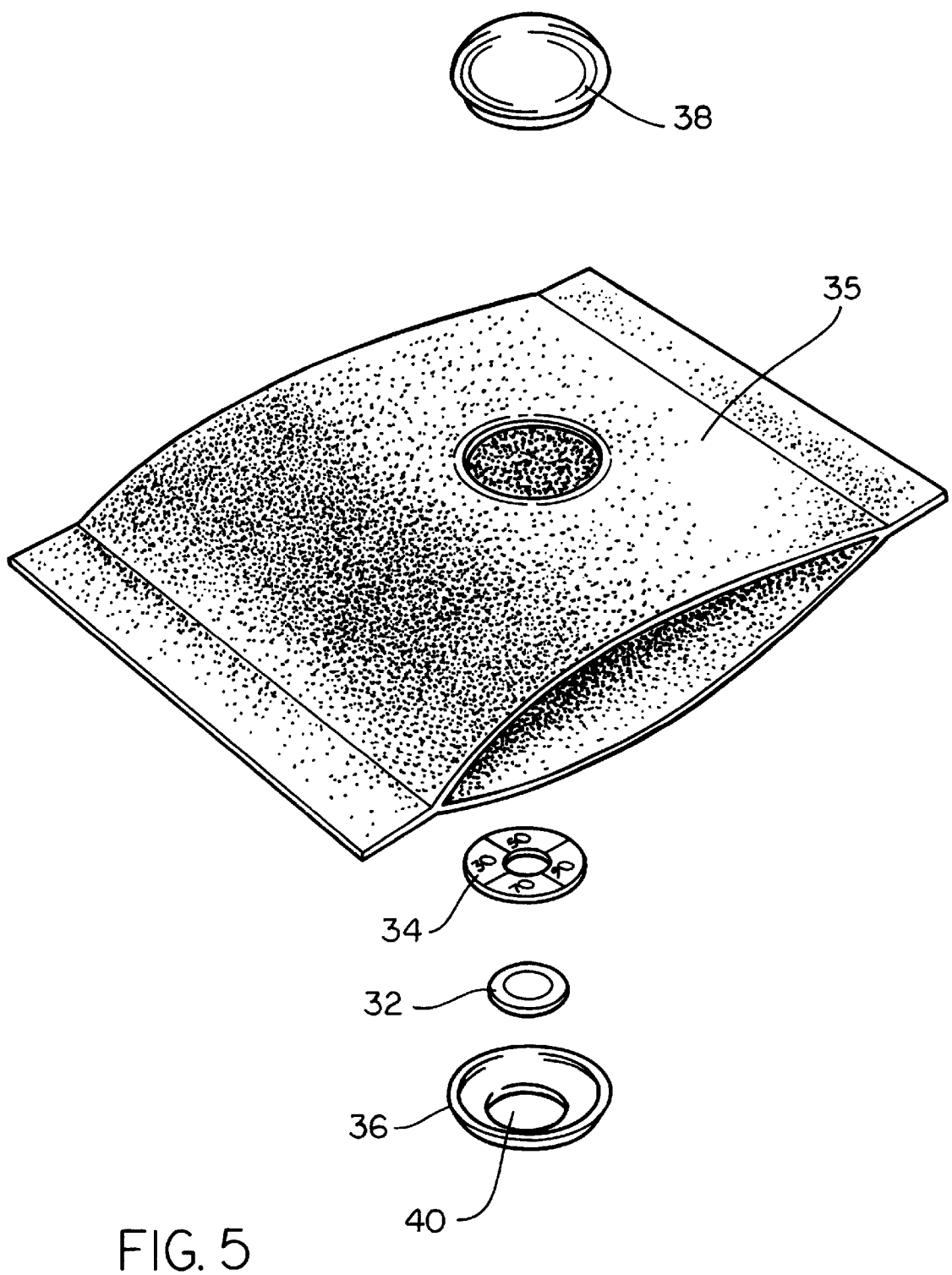
FIG. 5 is an exploded view of a fourth embodiment of the packaging container which includes a humidity indicator system.

In an alternative to the use of a circular disk, the second and third embodiments as shown in FIGS. 3 and 4 utilize a humidity indicator element (26) and humidity comparison element (28) secured in place to rectangular clear plastic pieces (30). The rectangular clear plastic pieces (30) are preferably made of the same material as is the circular plastic disk (24) of FIG. 2. The humidity indicator element (28) and humidity comparison element (30) are secured to the inside surface of the rectangular clear plastic piece (30), which is itself secured to the inner surface of the packaging container (31) by conventional means, such as by use of an adhesive or heat sealing, completely covering the opening (18) in the side of the container. By using a larger rectangular humidity indicator element (28) as shown in FIG. 4, more gradations of humidity can be measured.

As further alternative embodiments, the securing means for securing the humidity indicator element (32) and humidity comparison element (34) of Exhibits 5 and 6 to the packaging container (35) comprises an inner sealing ring (36) and an outer sealing cap (38). The outer sealing cap (38), and preferably the inner sealing ring (36), are manufactured from the same type of clear plastic material as is the clear plastic disk (24) of the plastic disk (24) shown in FIG. 2. In the embodiments shown in FIGS. 5 and 6, the inner sealing ring (36) contains an opening (40) in its center. The humidity indicator element (32) and humidity comparison element (34) are secured together and placed or secured over this circular opening (40) in the inner sealing ring (36). The clear plastic outer sealing cap (38) is then secured to the surface of the packaging container (35) and, at the same time, the inner seal ring (36) and the outer sealing cap (38) are sealed together. By this arrangement, the humidity indicator element can be viewed from outside of the packaging container (35). Humidity within the container reacts with the chemical material present on the humidity indicator element (32) to disclose the level of humidity within the container (35) because of the opening (40) in the inner sealing ring (36). The inner sealing ring (36) and outer sealing cap (38) are secured together by conventional means, such as heat sealing or adhesives.

Figure 6:
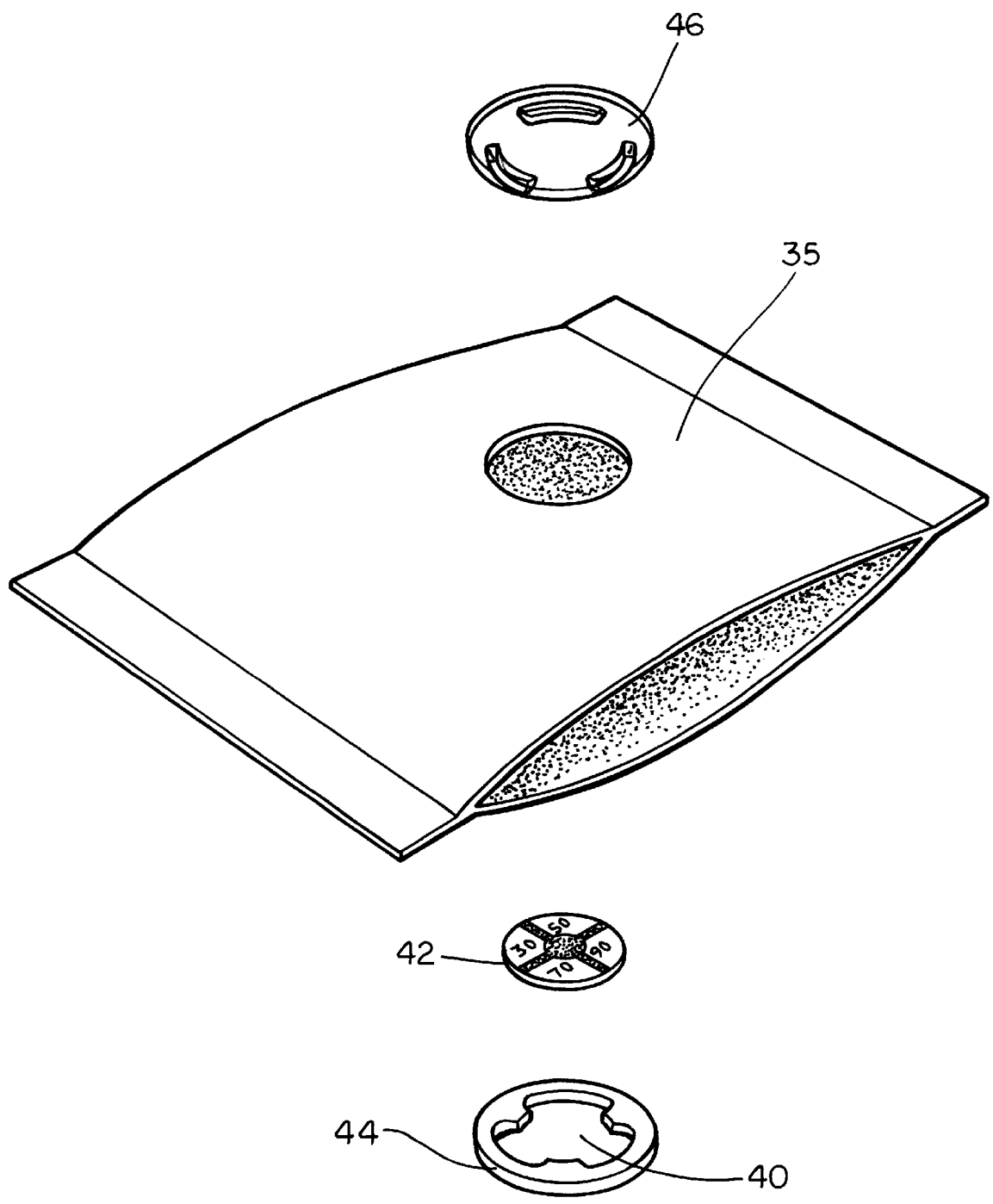
FIG. 6 is an exploded view of a fifth embodiment of the packaging container which includes a humidity indicator system.

Although the humidity indicator element and the humidity comparison element are preferably two separate and distinct elements, they may be manufactured as a single element (42) as shown in FIG. 6. The inner seal ring (44) and outer seal cap (46) of the device of FIG. 6 are joined together to secure the humidity indicator system of FIG. 6 in place against the packaging container (35).

Figure 7:
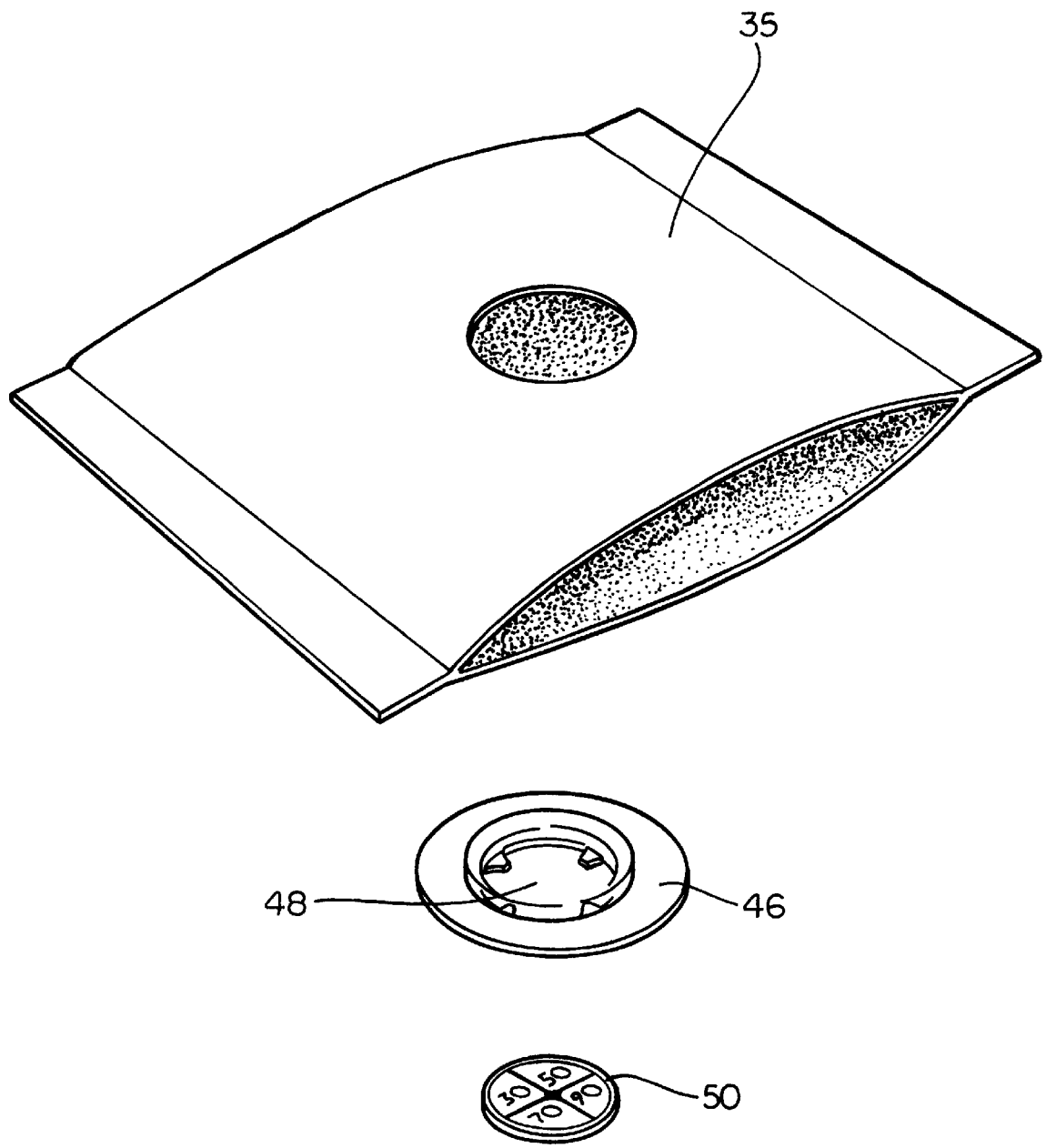
FIG. 7 is an exploded view of a sixth embodiment of the packaging container which includes a humidity indicator system.

As a further alternative embodiment, the inner seal ring and outer seal cap comprise a one-piece housing (46), preferably injection molded, as shown, for example, in FIG. 7. In this embodiment, the one piece housing (46) comprises a clear plastic disk, similar in composition to the clear plastic disk (24) of FIG. 2, onto which has been secured, preferably through an injection molding process, an opening (48) on its inner surface into which the combined humidity comparison element and humidity indicator element (50) is secured. In this embodiment, the combined humidity comparison element and humidity indicator element (50) is secured in the opening (48) to the inside surface of the injection molded one-piece element (50). The outer edges of this one-piece housing unit are then secured to the inside surface of the container by conventional means, such as by an adhesive or heat seal.

In forming the packaging container (10) of the instant invention, the anti-static, water and water vapor proof packaging material is first formed. (For ease of review, only the device of FIG. 2 will be discussed.) An opening (18) is then cut in the anti-static, water and water proof packaging material. All the edges (16) of the packaging container except one (17) are then closed. The elements of the humidity indicator system (12), including the humidity indicator element (20) and humidity comparison element (22), are then secured together by adhesive or other such sealing means. (If desired, the humidity indicator element and humidity comparison element can be prepared as a single unit as shown in FIGS. 6 and 7.) The humidity indicator element (20) is formed of conventional materials which can be purchased from companies, such as Humidial Corp. Once the humidity indicator element (20) and humidity comparison element (22) are secured together, they are secured to the inside surface of the clear disk (24) which is itself secured to the surface of the packaging container (10), preferably the inside surface. This humidity indicator system (12) seals the opening (18) completely closed. Once the humidity indicator system (12) is secured in place, the packaging container (10) is filled with the product for shipping, such as integrated circuits, along with a desiccant product that is needed to keep the moisture content low within the packaging container. The unsealed edge (17) of the container is then sealed. After sealing, a person can readily determine the moisture level within the packaging container (10) without opening the container by merely viewing the humidity indicator system (12). If the moisture content is too high, the integrated circuits can be removed from the packaging container (10) and treated to reduce any adverse effects of excess moisture on these products.

We claim:

1. A packaging container with sides containing a humidity indicator system comprising an anti-static, water and water vapor proof packaging material with edges, wherein a plurality of the edges of said packaging material are secured together to form a packaging bag with an inside surface and an outside surface, wherein an opening is present in one of the sides of said packaging bag, and a humidity indicator system comprising a humidity indicator element and a securing system, wherein the securing system comprises an inner sealing ring and an outer sealing cap for securing the humidity indicator element to the packaging bag, wherein said securing system is moisture and vapor proof, and wherein said securing system closes the opening in said packaging bag.

2. The packaging container of claim 1 wherein the humidity indicator system further comprises a humidity comparison element.

3. The packaging container of claim 2 wherein said securing system comprises a clear, plastic element with an inside surface and an outside surface, wherein said clear, plastic element is secured to the packaging bag to close the opening and wherein said humidity indicator element and humidity comparison element are secured to the inside surface of the clear, plastic element.

4. The packaging container of claim 2, wherein the humidity indicator element and humidity comparison element are secured to said inner sealing ring.

5. The packaging container of claim 2, wherein the humidity indicator element and humidity comparison element are secured to the outer sealing cap.

6. The packaging container of claim 1, wherein said outer sealing cap is secured to the packaging bag.

7. The packaging container of claim 1, wherein said inner sealing ring and outer sealing cap are secured together.

* * * * *